(12) United States Patent
Zhang (10) Patent No.: US 11,444,619 B2
(45) Date of Patent: Sep. 13, 2022

(54) DRIVING CIRCUIT

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/402,708

(22) Filed: Aug. 16, 2021

(65) Prior Publication Data

US 2022/0077853 A1 Mar. 10, 2022

Related U.S. Application Data (63) Continuation of application No. PCT/CN2021/100824, filed on Jun. 18, 2021.

(30) Foreign Application Priority Data

Sep. 7, 2020 (CN) .......................... 202010928768.0

(51) Int. Cl.
*H03K 5/01* (2006.01)
*H03K 17/687* (2006.01)
(Continued)

(52) U.S. Cl.
CPC ......... *H03K 17/6872* (2013.01); *H03K 5/133* (2013.01); *G11C 11/4063* (2013.01);
(Continued)

(58) Field of Classification Search
CPC ............... H03K 17/6872; H03K 5/133; H03K 2005/00019; H03K 2005/00078; G11C 11/4063
(Continued)

(56) References Cited

U.S. PATENT DOCUMENTS 5,509,040 A * 4/1996 Shimada ................ H03K 23/40
377/117
6,473,468 B1 * 10/2002 Do ....................... G11C 11/4096
365/189.11
(Continued)

FOREIGN PATENT DOCUMENTS

CN 1107379 C 4/2003
CN 101394177 B 8/2010
(Continued)

*Primary Examiner* — Ryan Jager
(74) *Attorney, Agent, or Firm* — Cooper Legal Group, LLC (57) ABSTRACT

A driving circuit, including: a pull-up transistor and a pull-down transistor, where a first terminal of the pull-up transistor is connected with a power source, a second terminal of the pull-up transistor is connected with a first terminal of the pull-down transistor to together output a driving signal, and a second terminal of the pull-down transistor is connected to ground; and a control circuit connected with a control terminal of the pull-up transistor and/or the pull-down transistor respectively and configured to control the on or off switching of the pull-up transistor and/or the pull-down transistor so as to change the driving signal. The pull-up transistor and the pull-down transistor are not switched on at the same time under the control of the control circuit.

12 Claims, 6 Drawing Sheets

(51) Int. Cl.
*H03K 5/133* (2014.01)
*G11C 11/4063* (2006.01)
*H03K 5/00* (2006.01)

(52) U.S. Cl.
CPC .............. *H03K 2005/00019* (2013.01); *H03K 2005/00078* (2013.01)

(58) Field of Classification Search
USPC ........................................................ 327/109
See application file for complete search history.

(56) References Cited

U.S. PATENT DOCUMENTS

| | | | | |
|---|---|---|---|---|
| 6,594,326 B1* | 7/2003 | Portmann | ................. | G06F 1/10 327/152 |
| 7,317,337 B2* | 1/2008 | Na | ................. | H03K 19/00384 326/86 |
| 9,397,638 B2* | 7/2016 | Lukes | ................. | H03K 19/0019 |
| 9,490,775 B2* | 11/2016 | Lukes | ................. | H03K 19/0019 |
| 9,612,614 B2* | 4/2017 | Bucelot | ................. | H03K 5/159 |
| 9,618,966 B2* | 4/2017 | Bucelot | ................. | G06F 1/10 |
| 2004/0017226 A1 | 1/2004 | Ivanov | | |
| 2004/0017228 A1 | 1/2004 | Ivanov | | |
| 2004/0085100 A1 | 5/2004 | Ivanov | | |
| 2014/0062565 A1* | 3/2014 | Sathe | ................. | H03K 19/003 327/294 |
| 2014/0062566 A1* | 3/2014 | Sathe | ................. | G06F 1/04 327/304 |
| 2016/0134272 A1 | 5/2016 | Wang | | |
| 2022/0077853 A1* | 3/2022 | Zhang | ................. | H03K 17/6872 |

FOREIGN PATENT DOCUMENTS

| | | |
|---|---|---|
| CN | 105978553 A | 9/2016 |
| CN | 107112988 A | 8/2017 |
| CN | 108736863 A | 11/2018 |

* cited by examiner

DRIVING CIRCUIT

CROSS-REFERENCE TO RELATED APPLICATION

This application is a continuation of International patent application No. PCT/CN2021/100824, filed on Jun. 18, 2021, which claims priority to Chinese patent application No. 202010928768.0, filed on Sep. 7, 2020 and entitled "Driving Circuit". The contents of International patent application No. PCT/CN2021/100824 and Chinese patent application No. 202010928768.0 are incorporated by reference in their entireties.

TECHNICAL FIELD

This application relates to a driving circuit.

BACKGROUND

A Dynamic Random Access Memory (DRAM) is now one of the important memory storage components. Due to multiple functions and low manufacturing cost, the DRAM is widely applied to fields, such as computers, communications and home appliances.

With the gradual popularity of mobile devices such as smart phones and tablet computers, most of the current mobile devices use the DRAM as a memory.

SUMMARY

According to a plurality of embodiments, a first aspect of this application provides a driving circuit, including:

a pull-up transistor and a pull-down transistor, where a first terminal of the pull-up transistor is connected with a power source, a second terminal of the pull-up transistor is connected with a first terminal of the pull-down transistor to commonly output a driving signal, and a second terminal of the pull-down transistor is connected to ground; and a control circuit connected with a control terminal of the pull-up transistor and/or the pull-down transistor respectively and configured to control the on or off switching of the pull-up transistor and/or the pull-down transistor so as to change the driving signal.

The pull-up transistor and the pull-down transistor are not switched on at the same time under the control of the control circuit.

Details of one or more embodiments of this application will be proposed in the following drawings and descriptions. Other features and advantages of this application will become apparent from the description, drawings and claims.

BRIEF DESCRIPTION OF THE DRAWINGS

In order to more clearly illustrate the technical solutions in the embodiments of this application or in the traditional technology, the drawings required for description in the embodiments or the traditional technology will be briefly described below. It is apparent that the drawings in the following description are only some embodiments of this application. Those skilled in the art can also obtain other drawings according to these drawings without any creative work.

LIST OF REFERENCE NUMERALS control circuit 100; pull-up transistor T1; pull-down transistor T2; first inverter 101; pull-up control circuit 110; first selection circuit 111; first transmission gate 1111; second transmission gate 1112; pull-down control circuit 120; second selection circuit 121; third transmission gate 1211; fourth transmission gate 1212; delay circuit 200; second inverter 210.

DETAILED DESCRIPTION

A DRAM has higher power consumption when reading and writing data and thus needs to consume a lot of electric energy. As a result, the battery consumption of a mobile device is fast, which greatly affects the user experience.

In order to facilitate the understanding of the embodiments of this application, the embodiments of this application will be described more comprehensively with reference to the related drawings. The preferred embodiment in the embodiments of this application is shown in the drawings. However, the embodiments of this application may be implemented in many different forms and are not limited to the embodiments described herein. On the contrary, the purpose of providing these embodiments is to make the disclosed contents of the embodiments of this application more thorough and comprehensive.

Unless defined otherwise, all technical and scientific terms used herein have the same meaning as commonly understood by those skilled in the art to which this application belongs. Herein, the terms used in the specification of the embodiments of this application are only for the purpose of describing specific embodiments, but are not intended to limit the embodiments of this application. The term "and/or" as used herein includes any and all combinations of one or more related listed items.

In the description of the embodiments of this application, it should be understood that the orientation or position relationships indicated by terms "upper", "lower", "vertical", "horizontal", "inside", "outside" and the like are based on orientation or position relationships shown in the drawings. These terms are only for the convenience of describing the embodiments of this application and simplifying the description, but do not indicate or imply that the specified device or component must have a specific orientation and must be constructed and operated in the specific orientation, and thus should not be understood as limiting the embodiments of this application.

Figure 1:
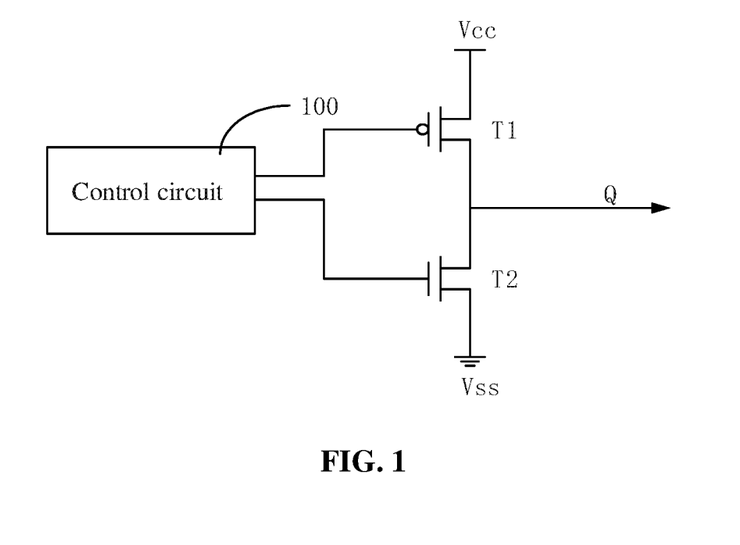
FIG. 1 is a schematic structural diagram of a driving circuit according to an embodiment.

FIG. 1 is a schematic structural diagram of a driving circuit according to an embodiment. Referring to FIG. 1, in this embodiment, the driving circuit includes a pull-up transistor T1, a pull-down transistor T2 and a control circuit 100. The pull-up transistor T1 and the pull-down transistor T2 are not switched on at the same time under the control of the control circuit 100.

A control terminal of the pull-up transistor T1 is connected with an output terminal of the control circuit 100, a first terminal of the pull-up transistor T1 is connected with a power source Vcc, a second terminal of the pull-up transistor T1 is connected with a first terminal of the pull-down transistor T2, and the pull-up transistor T1 is controlled by the control circuit 100 to change the voltage output by the second terminal of the pull-up transistor T1. Specifically, when the control circuit 100 controls the pull-up transistor T1 to be switched on, the first terminal and the second terminal of the pull-up transistor T1 are switched on, and then, the power source Vcc can pull up the output of the second terminal of the pull-up transistor T1 to the power source Vcc; and when the control circuit 100 controls the pull-up transistor T1 to be switched off, the first terminal and the second terminal of the pull-up transistor T1 are switched off.

A control terminal of the pull-down transistor T2 is connected with the output terminal of the control circuit 100, a first terminal of the pull-down transistor T2 is connected with a second terminal of the pull-down transistor T2, the second terminal of the pull-down transistor T2 is connected to the ground Vss, and the pull-down transistor T2 is controlled by the control circuit 100 to change the voltage output by the first terminal of the pull-down transistor T2. Specifically, when the control circuit 100 controls the pull-down transistor T2 to be switched on, the second terminal and the first terminal of the pull-down transistor T2 are switched on, and then, the output of the first terminal of the pull-down transistor T2 can be pulled down to the ground Vss; and when the control circuit 100 controls the pull-down transistor T2 to be switched off, the second terminal and the first terminal of the pull-down transistor T2 are switched off. The second terminal of the pull-up transistor T1 are connected with the first terminal of the pull-down transistor T2 to commonly output a driving signal Q, so that a higher level inversion speed of the driving signal Q can be realized.

The control circuit 100 is connected with the control terminal of the pull-up transistor T1 and/or the pull-down transistor T2 respectively and configured to control the on or off switching of the pull-up transistor T1 and/or the pull-down transistor T2, so as to change the driving signal Q. Specifically, by controlling the pull-up transistor T1 and the pull-down transistor T2 by the control circuit 100, the level state of the driving signal Q can be changed, such as switching from a high level to a low level, or switching from a low level to a high level.

It can be understood that the state switching of the switching-on or switching-off of a transistor is in response to the signal input by a control terminal. However, in a driving circuit, the signal switching of the control terminal is usually a gradual switching rather than a step switching. Exemplarily, assuming that the signal of the control terminal needs to be switched from 0V to 3.5V, the signal voltage of the control terminal gradually rises to 3.5V within a certain period of time, that is, a curve of the relationship between the signal voltage and time has a certain slope. The switching between a switched-on state and a switched-off state of the transistor is based on a threshold voltage as a critical point. For example, the threshold voltage may be 0.7V. Taking a low-level-enabled pull-up transistor T1 shown in FIG. 1 as an example, when the voltage of the control terminal drops to 0.7V, the transistor is switched to a switched-on state, and when the voltage of the control terminal rises to 0.7V, the transistor is switched to a switched-off state. Therefore, the reliability of the switching-on and switching-off of the transistor is insufficient, and there may be a condition that one of the pull-up transistor T1 and the pull-down transistor T2 is switched on, but the other one is still not switched off. That is, in the inversion process of the driving signal Q, there will be an intermediate state in which the pull-up transistor T1 and the pull-down transistor T2 are switched on at the same time. In this way, a direct current path from the power source Vcc to the ground will occur in each inversion process, which causes larger ineffective power consumption and results in the problem of higher power consumption of the driving circuit described in the background art.

In this embodiment, the control signal output by the control circuit 100 is controlled so that the pull-up transistor T1 and the pull-down transistor T2 are not switched on at the same time. That is, one of the pull-up transistor T1 and the pull-down transistor T2 is first switched to a switched-off state, and then the other one is switched to a switched-on state, which can prevent forming a direct current path between the power source Vcc and the ground Vss, thereby saving the ineffective power consumption. Furthermore, the competitive state generated when the two transistors are switched on at the same time can also be avoided, the current burr phenomenon generated when the two transistors are switched on at the same time is eliminated, and the stability of the output driving signal Q is improved. Therefore, through the above structure, this embodiment provides a driving circuit with lower power consumption and better signal stability.

In the embodiment shown in FIG. 1, the pull-up transistor T1 is low-level-enabled, and the pull-down transistor T2 is high-level-enabled. In other embodiments, a high-level-enabled pull-up transistor T1 and a low-level-enabled pull-down transistor T2 may be used. Transistors with the same enabling mode may also be used as the pull-up transistor T1 and the pull-down transistor T2, and two paths of control signals with different level states are respectively generated by the control circuit 100 and are respectively input to the pull-up transistor T1 and the pull-down transistor T2 in a one-to-one correspondence mode. Transistors of which the switching-off response speed is higher than the switching-on response speed may be selected as the pull-up transistor T1 and the pull-down transistor T2, so as to realize the desired timing for switching off and switching on. It should be noted that the pull-up transistor T1 and the pull-down transistor T2 in FIG. 1 are only used for exemplary description, but are not used for limiting the protection scope of this application, as long as one of the two transistors can be switched off first and then the other one is switched on. Other transistor structures or control logics of the control circuit 100 that can realize the above functions also fall within the protection scope of this application.

Figure 2:
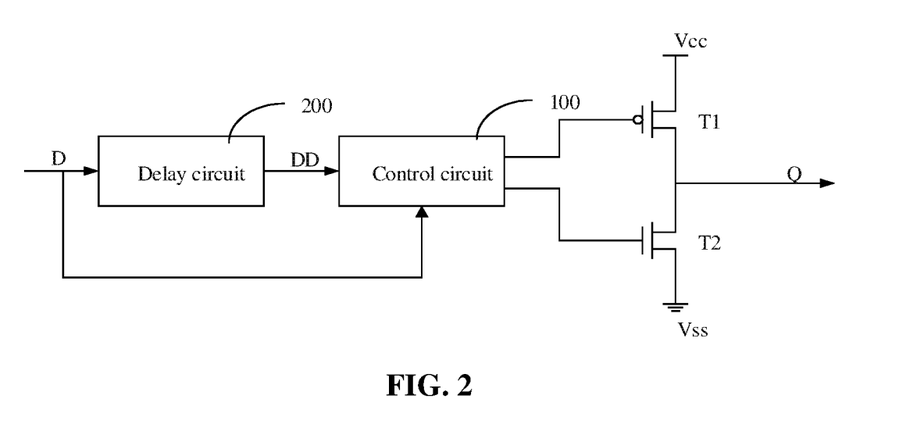
FIG. 2 is a schematic structural diagram of a driving circuit according to another embodiment.

FIG. 2 is a schematic structural diagram of a driving circuit according to another embodiment. Referring to FIG. 2, in this embodiment, the driving circuit includes a control circuit 100, a pull-up transistor T1, a pull-down transistor T2 and a delay circuit 200. The structures and connection modes of the control circuit 100, the pull-up transistor T1 and the pull-down transistor T2 are the same as those in the embodiment of FIG. 1, and will not be repeated here.

The delay circuit 200 is connected with the control circuit 100 and configured to receive an input signal D and perform a preset delay on the input signal D so as to generate a delayed input signal DD. Both the input signal D and the delayed input signal DD are input to the control circuit 100.

Specifically, the delay circuit 200 may be a fixed delay chain. In an example, the fixed delay chain may include a plurality of transmission gates connected in series, and each of the transmission gates is configured with a fixed delay time. Therefore, a corresponding number of transmission gates may be set according to the preset delay time required by the delay circuit 200, so as to generate a target preset delay time. In another example, the fixed delay chain may also include an even number of inverters connected in series. By disposing an even number of inverters, the level states of the output delayed input signal DD and the input signal D may be ensured to correspond with each other, and there is only a difference in timing. Similar to the fixed delay chain formed by the transmission gates as described above, a corresponding number of inverters may be set according to the preset delay time required by the delay circuit 200, so as to generate a target preset delay time.

The delay circuit 200 may also be a variable delay chain. It can be understood that the on-off characteristics of the pull-up transistor T1 and the pull-down transistor T2 and the transmission speed on a signal transmission path will change with conditions such as a temperature of a use environment. Therefore, if the conditions of the use environment change, there is a risk of causing errors in the on-off timing of the pull-up transistor T1 and the pull-down transistor T2. In this embodiment, by disposing the delay circuit 200 formed by the variable delay chain and disposing a corresponding detection structure, the changes in the conditions of the use environment of the driving circuit can be detected through the detection structure, and the delay time of the variable delay chain can be adjusted according to a detection result, thereby avoiding errors in the on-off timing of the pull-up transistor T1 and the pull-down transistor T2, avoiding the formation of a direct current path between the power source Vcc and the ground Vss, and preventing the ineffective power consumption of the driving circuit. That is, a driving circuit with lower power consumption is provided.

Figure 3:
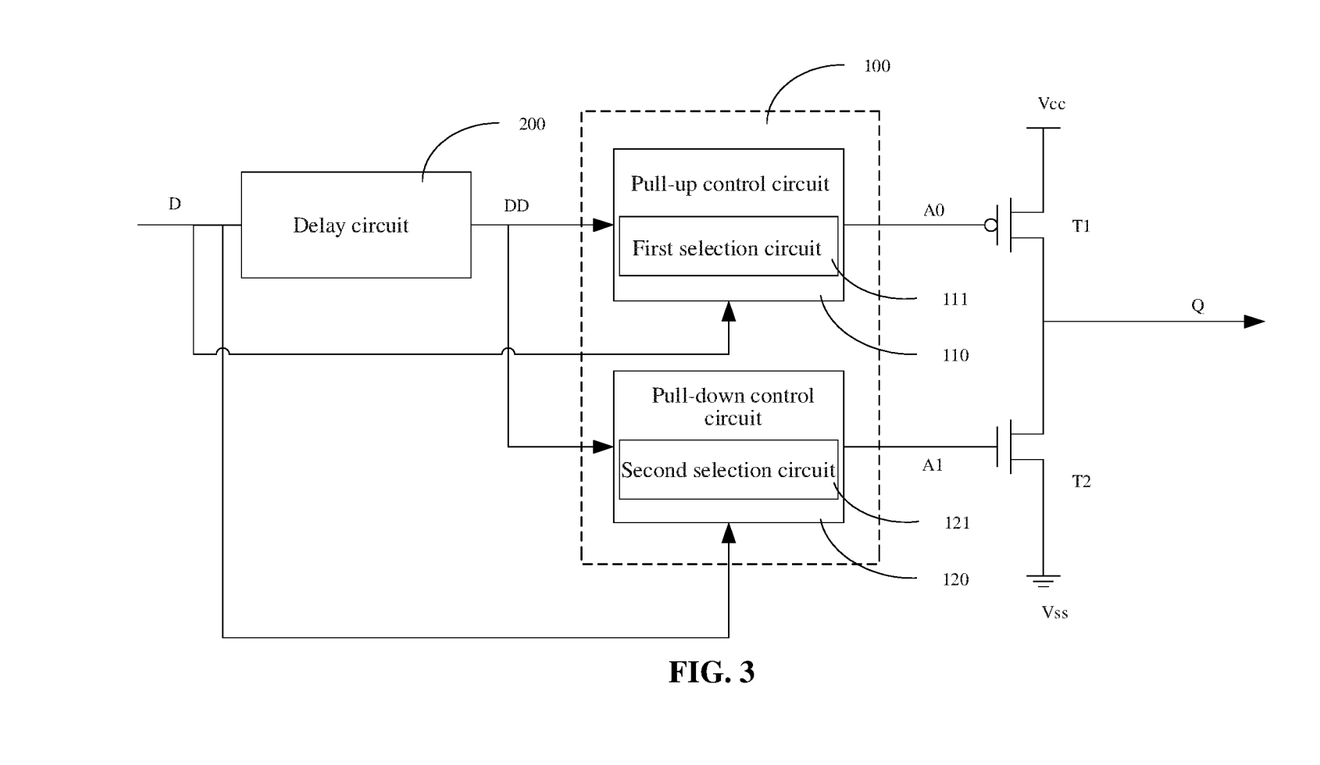
FIG. 3 is a schematic structural diagram of a driving circuit according to yet another embodiment.

FIG. 3 is a schematic structural diagram of a driving circuit according to yet another embodiment. Referring to FIG. 3, in this embodiment, the driving circuit includes a control circuit 100, a pull-up transistor T1, a pull-down transistor T2 and a delay circuit 200. The structures and connection modes of the delay circuit 200, the pull-up transistor T1 and the pull-down transistor T2 are the same as those in the embodiment of FIG. 2, and will not be repeated here.

In this embodiment, the control circuit 100 specifically includes a pull-up control circuit 110 and a pull-down control circuit 120. The pull-up control circuit 110 is connected with the control terminal of the pull-up transistor T1 and configured to control the switching-on or switching-off of the pull-up transistor T1. The pull-up control circuit 110 receives the input signal D and the delayed input signal DD, and generates a pull-up control signal A0 according to the input signal D and the delayed input signal DD. The pull-down control circuit 120 is connected with the control terminal of the pull-down transistor T2 and configured to control the switching-on or switching-off of the pull-down transistor T2. The pull-down control circuit 120 receives the input signal D and the delayed input signal DD, and generates a pull-up control signal A1 according to the input signal D and the delayed input signal DD. The pull-up control signal A0 and the pull-up control signal A1 have different timings, and the timing difference between the pull-up control signal A0 and the pull-up control signal A1 can ensure that one of the pull-up transistor T1 and the pull-down transistor T2 is switched off first and then the other one is switched on. That is, the timing relationship between the two control signals corresponds to the on and off sequence of the two transistors.

Further, the control circuit 100 is further configured to receive the driving signal Q, and selectively output the input signal D or the delayed input signal DD according to the driving signal Q, so as to control the pull-up transistor T1 and the pull-down transistor T2 to be switched on or switched off sequentially according to a preset sequence.

Specifically, continuing to refer to FIG. 3, in one of the embodiments, the pull-up control circuit 110 includes a first selection circuit 111, an input terminal of the first selection circuit 111 is configured to receive the input signal D, the other input terminal of the first selection circuit 111 is configured to receive the delayed input signal DD, a control terminal of the first selection circuit 111 is configured to receive the driving signal Q, and an output terminal of the first selection circuit 111 is connected with the control terminal of the pull-up transistor T1. The first selection circuit 111 is configured to select one of the input signal D and the delayed input signal DD as the pull-up control signal A0 according to the driving signal Q, so as to control the on or off switching of the pull-up transistor T1, thereby realizing the adjustment of the driving signal Q.

It can be understood that the driving circuit of this embodiment is configured to realize the inversion of the level state of the driving signal Q. That is, the level state of the driving signal Q after the inversion is completely opposite to the level state of the driving signal Q before the inversion. Therefore, in this embodiment, by inputting the driving signal Q to the control circuit 100 again, a feedback loop may be formed between the driving circuit and the pull-up transistor T1 and the pull-down transistor T2 without the additional input of other selection signals. That is, the output of the first selection circuit III may be selected, thereby realizing a driving circuit with a simpler control method and higher reliability.

The pull-down control circuit 120 includes a second selection circuit 121. An input terminal of the second selection circuit 121 is configured to receive the input signal D, the other input terminal of the second selection circuit 121 is configured to receive the delayed input signal DD, a control terminal of the second selection circuit 121 is configured to receive the driving signal Q, and an output terminal of the second selection circuit 121 is connected with the control terminal of the pull-down transistor T2. Similar to the above first selection circuit 111, the second selection circuit 121 is configured to select one of the input signal D and the delayed input signal DD as the pull-up control signal A1 according to the driving signal Q, so as to control the on or off switching of the pull-down transistor T2, thereby realizing the adjustment of the driving signal Q. The pull-up control signal A0 and the pull-up control signal A1 are different, and are respectively one of the input signal D and the delayed input signal DD.

Figure 4:
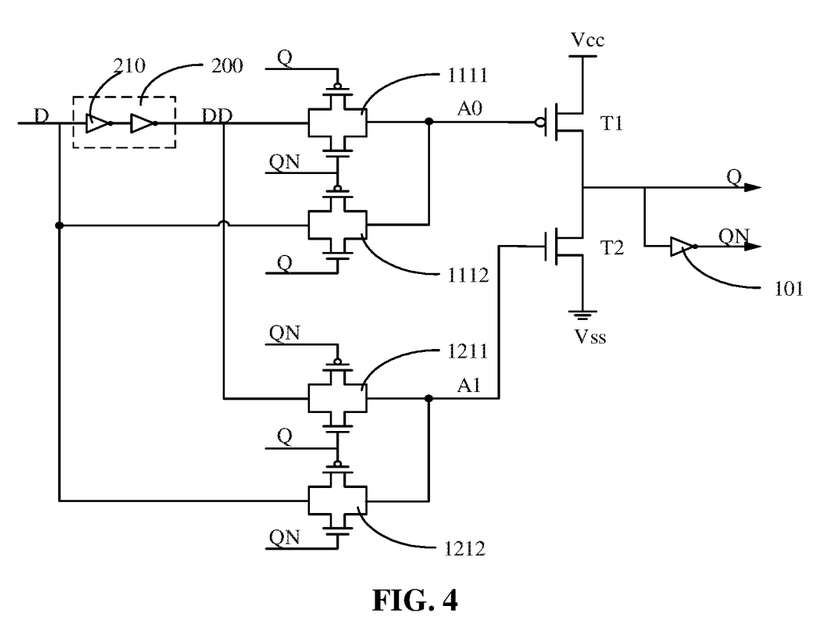
FIG. 4 is a schematic structural diagram of a driving circuit according to still another embodiment.

FIG. 4 is a schematic structural diagram of a driving circuit according to still another embodiment. Referring to FIG. 4, the first selection circuit 111 and the second selection circuit 121 each includes two transmission gates, one control terminal of the transmission gate is configured to input the driving signal Q, the other control terminal of the transmission gate is configured to input an inverted signal QN of the driving signal, and the signals input by the two control terminals of the transmission gate are configured to commonly control the on or off switching of the transmission gate. The driving circuit further includes a first inverter 101, and an input terminal of the first inverter 101 is connected with the second terminal of the pull-up transistor T1 to invert the driving signal Q, thereby generating the inverted signal QN of the driving signal. Specifically, in this embodiment, the first selection circuit 111 includes a first transmission gate 1111 and a second transmission gate 1112, the second selection circuit 121 includes a third transmission gate 1211 and a fourth transmission gate 1212, and the first selection circuit 111 and the second selection circuit 121 have the same hardware structure.

Here, the first selection circuit 111 is taken as an example for description. The first transmission gate 1111 and the second transmission gate 1112 have the same hardware structure and are respectively configured with an input terminal and two control terminals, and in the two control terminals, a first control terminal is low-level-enabled, and a second control terminal is high-level-enabled. The input terminal of the first transmission gate 1111 is configured to input the delayed input signal DD, the first control terminal of the first transmission gate 1111 is configured to input the driving signal Q, the second control terminal of the first transmission gate 1111 is configured to input the inverted signal QN of the driving signal, the input terminal of the second transmission gate 1112 is configured to input the input signal D, the first control terminal of the second transmission gate 1112 is configured to input the inverted signal QN of the driving signal, and the second control terminal of the second transmission gate 1112 is configured to input the driving signal Q.

It can be understood that based on the above structure, at the same moment, only one of the first transmission gate 1111 and the second transmission gate 1112 can output a signal, thereby realizing a selection function of the signal. Furthermore, the switching speed of a transistor from a switched-on state to a switched-off state is different from the switching speed of the transistor from a switched-off state to a switched-on state. Therefore, in this embodiment, by disposing two transistors with different enabling modes in the transmission gate and respectively connecting the output terminals of the two transistors in a one-to-one correspondence mode, when the driving signal Q changes, the switching speeds of the on and off states of the two transistors in each of the transmission gates are different, and the desired pull-up control signal A0 can be output as long as one of the two transistors in the transmission gate is switched on, so as to increase the output speed of the first selection circuit 111.

The third transmission gate 1211 of the second selection circuit 121 corresponds to the above first transmission gate 1111, and the fourth transmission gate 1212 corresponds to the above second transmission gate 1112. Therefore, the operation mode of the second selection circuit 121 may refer to the operation mode of the above first selection circuit 111, and will not be repeated here. It should be noted that the first selection circuit 111 and the second selection circuit 121 are not limited to the structure shown in the embodiment of FIG. 4. In other embodiments, the first selection circuit 111 and the second selection circuit 121 may also be multiplexers (two-to-one selector) with other structures that implement the function of selecting one from two.

Continuing to refer to FIG. 4, in this embodiment, the delay circuit 200 includes two second inverters 210 connected in series to generate the delayed input signal DD, and the phase difference between the delayed input signal DD and the input signal D is equal to the sum of the delay times of the two inverters.

Further, if a memory is a DDR4, the pull-up transistor T1 is a P-type transistor, the pull-down transistor T2 is an N-type transistor, and the DDR4 has lower requirements for the transmission speed and driving performance, and thus the P-type transistor can be used. If a memory is an LPDDR4, the pull-up transistor T1 is an N-type transistor, the pull-down transistor T2 is an N-type transistor, the LPDDR4 has higher requirements for the performance of the driving circuit, and compared with the P-type pull-up transistor T1, the N-type pull-up transistor T1 can transmit a signal lower than the power source Vcc. Therefore, compared with the driving circuit in which the pull-up transistor T1 is a P-type transistor, the driving circuit of this embodiment can transmit a signal with a smaller output voltage swing than the driving circuit in which the pull-up transistor T1 is a P-type transistor, thereby realizing lower power consumption. In addition, compared with the P-type transistor, by using the N-type transistor as the pull-up transistor T1, the size of the driving circuit can be effectively reduced. Further, the pull-up transistor T1 and the pull-down transistor T2 may use the same N-type transistor, thereby improving the symmetrical characteristics of the pull-up transistor T1 and the pull-down transistor T2 so as to further improve the performance of the driving circuit.

Figure 5:
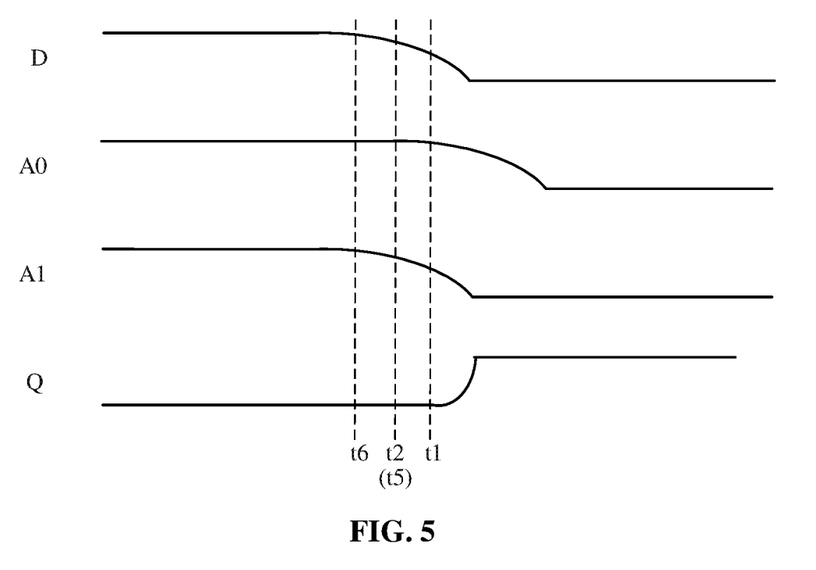
FIG. 5 is a timing diagram of a process that a pull-down transistor is switched off and a pull-up transistor is switched on according to an embodiment.

FIG. 5 is a timing diagram of a process that the pull-down transistor T2 is switched off and the pull-up transistor T1 is switched on according to an embodiment. Referring to FIG. 5, in this embodiment, the pull-up transistor T1 is defined to switch from a switched-off state to a switched-on state at time t1, and the pull-down transistor T2 is defined to switch from a switched-on state to a switched-off state at time t2. In a process that the pull-down transistor T2 is switched off and the pull-up transistor T1 is switched on, the time t2 is earlier than the time t1. Through the above timing relationship, the pull-down transistor T2 can be switched off first, and then the pull-up transistor T1 can be switched on, which prevents forming a direct current path between the power source Vcc and the ground Vss, so as to avoid ineffective power consumption.

Further, the above purpose of state switching can be realized by adjusting the timing of the input signals D of the control terminals of the two transistors. Specifically, in this embodiment, the response speed of the pull-up transistor T1 is the same as the response speed of the pull-down transistor T2, that is, the time duration of switching the pull-up control signal A0 from a high level to a low level is the same as the time duration of switching the pull-up control signal A1 from a high level to a low level. Continuing to refer to FIG. 5, the start time at which a signal input by the control terminal of the pull-up transistor T1 is converted from a high level to a low level is defined as t5, and the start time at which a signal input by the control terminal of the pull-down transistor T2 is converted from a high level to a low level is defined as t6. In a process that the pull-down transistor T2 is switched off and the pull-up transistor T1 is switched on, the time t6 is earlier than the time t5. In this embodiment, based on the pull-up transistor T1 and the pull-down transistor T2 with the same response speed, by setting the corresponding signal input time, the state switching time of the pull-up transistor T1 and the pull-down transistor T2 can be controlled, thereby realizing a driving circuit with a simple control logic and an accurate level state inversion result of the driving signal Q. Further, in this embodiment, the t2 and the t5 are set to be the same time, so as to further ensure the reliability of the time sequence.

Figure 6:
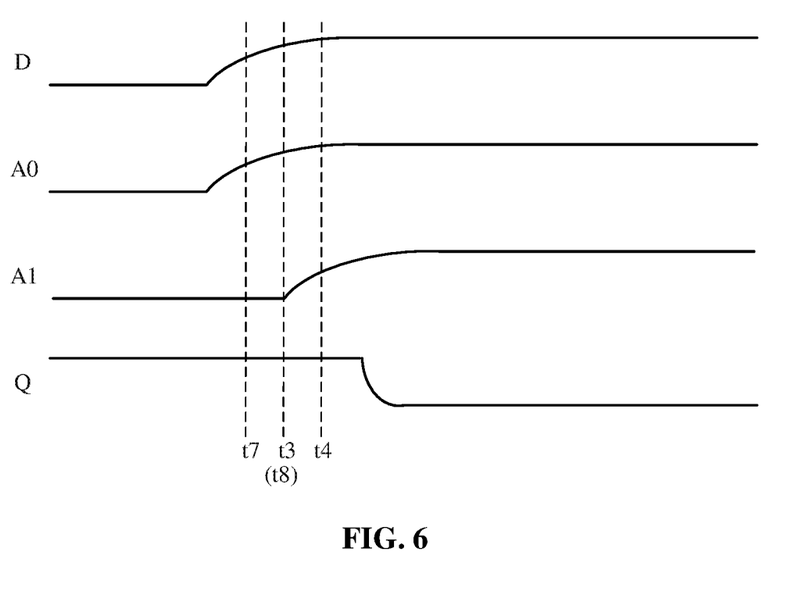
FIG. 6 is a timing diagram of a process that a pull-up transistor is switched off and a pull-down transistor is switched on according to an embodiment.

FIG. 6 is a timing diagram of a process that the pull-up transistor T1 is switched off and the pull-down transistor T2 is switched on according to an embodiment. Referring to FIG. 6, in this embodiment, the pull-up transistor T1 is defined to switch from a switched-on state to a switched-off state at time t3, and the pull-down transistor T2 is defined to switch from a switched-off state to a switched-on state at time t4. In a process that the pull-up transistor T1 is switched off and the pull-down transistor T2 is switched on, the time t3 is earlier than the time t4. Through the above timing relationship, the pull-up transistor T1 can be switched off first, and then the pull-down transistor T2 can be switched on, which prevents forming a direct current channel between the power source Vcc and the ground Vss, so as to avoid ineffective power consumption.

Further, the above purpose of state switching can be realized by adjusting the timing of the input signals of the control terminals of the two transistors. Specifically, in this embodiment, continuing to refer to FIG. 6, the start time at which the signal input by the control terminal of the pull-up transistor T1 is converted from a low level to a high level is defined as t7, and the start time at which the signal input by the control terminal of the pull-down transistor T2 is converted from a low level to a high level is defined as t8. In a process that the pull-up transistor T1 is switched off and the pull-down transistor T2 is switched on, the time t7 is earlier than the time t8. In this embodiment, based on the pull-up transistor T1 and the pull-down transistor T2 with the same response speed, by setting the corresponding signal input time, the state switching time of the pull-up transistor T1 and the pull-down transistor T2 can be controlled, thereby realizing a driving circuit with a simple control logic and an accurate level state inversion result of the driving signal Q.

The technical features of the above embodiments can be combined arbitrarily. In order to make the description concise, all possible combinations of various technical features in the above embodiments are not completely described. However, as long as there is no contradiction in the combination of these technical features, it should be regarded as the scope of this specification.

The foregoing embodiments only describe several implementations of this application, and their descriptions are relatively specific and detailed, but cannot therefore be understood as a limitation to the patent scope of the disclosure. It should be noted that those of ordinary skill in the art may further make several variations and improvements without departing from the conception of the embodiments of this application, and these all fall within the protection scope of the embodiments of this application. Therefore, the protection scope of the embodiments of this application should be subject to the appended claims.

The invention claimed is:

1. A driving circuit, comprising:
   a pull-up transistor and a pull-down transistor, wherein a first terminal of the pull-up transistor is connected with a power source, a second terminal of the pull-up transistor is connected with a first terminal of the pull-down transistor to commonly output a driving signal, and a second terminal of the pull-down transistor is connected to ground; and
   a control circuit connected with a control terminal of at least one of the pull-up transistor or the pull-down transistor respectively and configured to control on or off switching of at least one of the pull-up transistor or the pull-down transistor so as to change the driving signal,
   wherein the pull-up transistor and the pull-down transistor are not switched on at the same time under the control of the control circuit,
   wherein the driving circuit further comprises:
      a delay circuit connected with the control circuit and configured to receive an input signal and perform a preset delay on the input signal to generate a delayed input signal,
   wherein both the input signal and the delayed input signal are input to the control circuit,
   wherein the control circuit is further configured to receive the driving signal and selectively output the input signal or the delayed input signal according to the driving signal, to control the pull-up transistor and the pull-down transistor to be switched on or switched off sequentially according to a preset sequence.

2. The driving circuit of claim 1, wherein the control circuit comprises:
   a pull-up control circuit connected with the control terminal of the pull-up transistor and configured to control the on or off switching of the pull-up transistor; and
   a pull-down control circuit connected with the control terminal of the pull-down transistor and configured to control the on or off switching of the pull-down transistor.

3. The driving circuit of claim 2, wherein the pull-up control circuit comprises a first selection circuit, wherein an input terminal of the first selection circuit is configured to receive the input signal, the other input terminal of the first selection circuit is configured to receive the delayed input signal, a control terminal of the first selection circuit is configured to receive the driving signal, and an output terminal of the first selection circuit is connected with the control terminal of the pull-up transistor; and
   the pull-down control circuit comprises a second selection circuit, wherein an input terminal of the second selection circuit is configured to receive the input signal, the other input terminal of the second selection circuit is configured to receive the delayed input signal, a control terminal of the second selection circuit is configured to receive the driving signal, and an output terminal of the second selection circuit is connected with the control terminal of the pull-down transistor.

4. The driving circuit of claim 3, wherein the first selection circuit and the second selection circuit each comprises two transmission gates, wherein a control terminal of the transmission gate is configured to input the driving signal, the other control terminal of the transmission gate is configured to input an inverted signal of the driving signal, and the signals input by the two control terminals of the transmission gate are configured to commonly control the switching-on or switching-off of the transmission gate.

5. The driving circuit of claim 1, wherein the pull-up transistor is an N-type transistor or a P-type transistor, and the pull-down transistor is an N-type transistor.

6. The driving circuit of claim 1, wherein the pull-up transistor is defined to switch from a switched-off state to a switched-on state at time t1, and the pull-down transistor is defined to switch from a switched-on state to a switched-off state at time t2,
   wherein in a process that the pull-down transistor is switched off and the pull-up transistor is switched on, the time t2 is earlier than the time t1.

7. The driving circuit of claim 1, wherein the pull-up transistor is defined to switch from a switched-on state to a switched-off state at time t3, and the pull-down transistor is defined to switch from a switched-off state to a switched-on state at time t4,
   wherein in a process that the pull-up transistor is switched off and the pull-down transistor is switched on, the time t3 is earlier than the time t4.

8. The driving circuit of claim 1, wherein a start time at which a signal input by the control terminal of the pull-up transistor is converted from a high level to a low level is defined as t5, and a start time at which a signal input by the control terminal of the pull-down transistor is converted from a high level to a low level is defined as t6, wherein in a process that the pull-down transistor is switched off and the pull-up transistor is switched on, the start time t6 is earlier than the start time t5.

9. The driving circuit of claim 1, wherein a start time at which a signal input by the control terminal of the pull-up transistor is converted from a low level to a high level is defined as t7, and a start time at which a signal input by the control terminal of the pull-down transistor is converted from a low level to a high level is defined as t8, wherein in a process that the pull-up transistor is switched off and the pull-down transistor is switched on, the start time t7 is earlier than the start time t8.

10. The driving circuit of claim 1, wherein the delay circuit is a fixed delay chain.

11. The driving circuit of claim 10, wherein the fixed delay chain comprises an even number of inverters connected in series.

12. The driving circuit of claim 1, wherein the delay circuit is a variable delay chain.

* * * * *